(12) United States Patent
Gates et al.

(10) Patent No.: US 7,049,247 B2
(45) Date of Patent: May 23, 2006

(54) METHOD FOR FABRICATING AN ULTRALOW DIELECTRIC CONSTANT MATERIAL AS AN INTRALEVEL OR INTERLEVEL DIELECTRIC IN A SEMICONDUCTOR DEVICE AND ELECTRONIC DEVICE MADE

(75) Inventors: Stephen M. Gates, Ossining, NY (US); Alfred Grill, White Plains, NY (US); David R. Medeiros, Ossining, NY (US); Deborah Neumayer, Danbury, CT (US); Son Van Nguyen, Yorktown Heights, NY (US); Vishnubhai V. Patel, Yorktown Heights, NY (US); Xinhui Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 10/838,849

(22) Filed: May 3, 2004

(65) Prior Publication Data
US 2005/0245096 A1 Nov. 3, 2005

(51) Int. Cl.
*H01L 21/31* (2006.01)
(52) U.S. Cl. .................. 438/778; 438/780; 438/782
(58) Field of Classification Search ................ 438/758, 438/778, 780, 782
See application file for complete search history.

(56) References Cited

U.S. PATENT DOCUMENTS 6,716,770 B1 *  4/2004  O'Neill et al. .............. 438/780
6,790,789 B1 *  9/2004  Grill et al. .................. 438/778
2002/0037442 A1  3/2002  Grill et al.
2003/0143865 A1  7/2003  Grill et al.
2003/0211244 A1  11/2003  Li et al.

FOREIGN PATENT DOCUMENTS

EP          1 354 980 A1    10/2003
EP          1 482 070 A1    12/2004
WO      WO 03/088344 A1    10/2003

OTHER PUBLICATIONS

Bilodeau, S.M., "Chemical Routes to Improved Mechanical Properties of PECVD Low K Thin Films." Mat. Res. Soc. Symp. Proc. vol. 812 (2004).
Grill, A. et al., "Ultralow-k Dielectrics Prepared By Plasma-Enhanced Chemical Vapor Deposition." Appl. Phys. Lett. vol. 79, No. 6 (2001).

* cited by examiner

*Primary Examiner*—David Nelms
*Assistant Examiner*—Renee R. Berry
(74) *Attorney, Agent, or Firm*—Scully, Scott, Murphy & Presser; Robert M. Trepp, Esq.

(57) ABSTRACT

A method for fabricating a thermally stable ultralow dielectric constant film comprising Si, C, O and H atoms in a parallel plate chemical vapor deposition process utilizing a plasma enhanced chemical vapor deposition ("PECVD") process is disclosed. Electronic devices containing insulating layers of thermally stable ultralow dielectric constant materials that are prepared by the method are further disclosed. To enable the fabrication of a thermally stable ultralow dielectric constant film, specific precursor materials are used, such as, silane derivatives, for instance, diethoxymethylsilane (DEMS) and organic molecules, for instance, bicycloheptadiene and cyclopentene oxide.

28 Claims, 6 Drawing Sheets

METHOD FOR FABRICATING AN ULTRALOW DIELECTRIC CONSTANT MATERIAL AS AN INTRALEVEL OR INTERLEVEL DIELECTRIC IN A SEMICONDUCTOR DEVICE AND ELECTRONIC DEVICE MADE

CROSS-REFERENCE TO RELATED APPLICATIONS

The present application is related to co-assigned U.S. Pat. Nos. 6,147,009, 6,312,793, 6,441,491, 6,437,443, 6,541,398, 6,479,110 B2, and 6,497,963, the contents of which are incorporated herein by reference in their entirety. The present application is also related to co-pending and co-assigned U.S. patent application Ser. No. 10/174,749, filed Jun. 19, 2002, Ser. No. 10/340,000, filed Jan. 23, 2003, Ser. No. 10/390,801, filed Mar. 18, 2003, and Ser. No. 10/758,724, filed Jan. 16, 2004, the contents of each of the aforementioned U.S. Patent Applications are also incorporated herein by reference in their entirety as well.

FIELD OF THE INVENTION

The present invention generally relates to a method for fabricating a dielectric material that has an ultralow dielectric constant (or ultralow k) and an electronic device containing such a dielectric material. More particularly, the present invention relates to a method for fabricating a thermally stable ultralow k film for use as an intralevel or interlevel dielectric in an ultra-large-scale integration ("ULSI") back-end-of-the-line ("BEOL") wiring structure and an electronic structure formed by such a method.

BACKGROUND OF THE INVENTION

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances. Dielectric materials (i.e., dielectrics) that have low k values are commercially available. One such commercially available material, for example, is polytetrafluoroethylene ("PTFE"), which has a dielectric constant of about 2.0. Most commercially available dielectric materials however are not thermally stable when exposed to temperatures above 300° C. Integration of low k dielectrics in present ULSI chips requires a thermal stability of at least 400° C.

The low k materials that have been considered for applications in ULSI devices include polymers containing elements of Si, C, O and H, such as methylsiloxane, methylsilsesquioxanes, and other organic and inorganic polymers. For instance, a paper (N. Hacker et al. "Properties of new low dielectric constant spin-on silicon oxide based dielectrics" *Mat. Res. Soc. Symp. Proc.* 476 (1997): 25) describes materials that appear to satisfy the thermal stability requirement, even though some of these materials propagate cracks easily when reaching thicknesses needed for integration in an interconnect structure when films are prepared by a spin-on technique. Furthermore, these prior art precursor materials are high cost and prohibitive for use in mass production. Moreover, most of the fabrication steps of very-large-scale-integration ("VLSI") and ULSI chips are carried out by plasma enhanced chemical or physical vapor deposition techniques.

The ability to fabricate a low k material by a plasma enhanced chemical vapor deposition (PECVD) technique using previously installed and available processing equipment will thus simplify its integration in the manufacturing process, reduce manufacturing cost, and create less hazardous waste. U.S. Pat. Nos. 6,147,009 and 6,497,963 describe a low dielectric constant material consisting of elements of Si, C, O and H atoms having a dielectric constant not more than 3.6 and which exhibits very low crack propagation velocities.

U.S. Pat. Nos. 6,312,793, 6,441,491, 6,541,398 and 6,479,110 B2 describe a multiphase low k dielectric material that consists of a matrix phase composed of elements of Si, C, O and H and another phase composed mainly of C and H. The dielectric materials disclosed in the foregoing patents have a dielectric constant of not more than 3.2.

U.S. Pat. No. 6,437,443 describes a low k dielectric material that has two or more phases wherein the first phase is formed of a SiCOH material. The low k dielectric material is provided by reacting a first precursor gas containing atoms of Si, C, O, and H and at least a second precursor gas containing mainly atoms of C, H, and optionally F, N and O in a plasma enhanced chemical vapor deposition chamber.

Despite the numerous disclosures of low k dielectric materials, there is a continued need for developing a dielectric material that has a dielectric constant of not more than about 2.5, which has a low stress and thermal stability within processing temperatures used in current ULSI technologies.

SUMMARY OF THE INVENTION

The present invention provides a method for fabricating an ultralow dielectric constant (i.e., ultralow k) material having a dielectric constant of not more than about 2.5. More preferably, the dielectric constant for the ultralow k material that is provided in the present invention is from about 1.5 to about 2.5, and most preferably, the dielectric constant is from about 1.8 to about 2.25. It should be noted that all dielectric constants are relative to a vacuum unless otherwise specified.

The present invention also provides a method for fabricating an ultralow dielectric constant material comprising Si, C, O and H atoms from a mixture of at least two precursors, wherein a first precursor is selected from silane ($SiH_4$) derivatives having the molecular formula $SiRR'R''R'''$ where R,R',R'', and R''' may or may not be the same or different and are selected from H, alkyl, and alkoxy. Preferably R, R', R'' and R''' are the same or different and are methyl, ethyl, methoxy, and ethoxy. Preferred first precursors include, but are not limited to: diethoxydimethylsilane, diethoxymethylsilane(DEMS), ethoxyltrimethylsilane, ethoxydimethylsilane, dimethoxydimethylsilane, dimethoxymethylsilane, triethoxysilane, and trimethoxymethylsilane.

The second precursor employed in the present application is an organic compound selected from:

alkenes: 

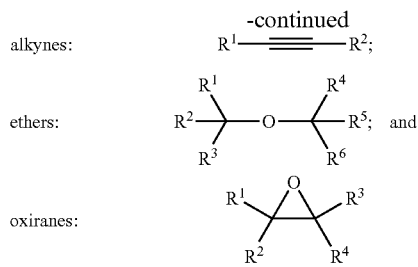

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents. Preferred second precursors include, but are not limited to: ethylene oxide, propylene oxide, cyclopentene oxide, isobutylene oxide, 2,2,3-trimethyloxirane, butadienemonoxide, bicycloheptadiene, 1,2-epoxy-5-hexene, 2-methyl-2-vinyloxirane, 1-isopropyl-cyclohexa-1,3-diene and tertbutylmethylether.

The use of the first precursor that includes a silane derivative in combination with the second organic precursor enables an efficient incorporation of a pore forming phase in a SiCOH matrix and the preparation of SiCOH films at lower cost than with precursors described in the prior art.

The use of the first precursor that includes a silane derivative in combination with the second organic precursor can enable a porous SiCOH dielectric having a reduced tensile stress, according to the methods of this invention.

The present invention further provides a method for fabricating an ultralow k dielectric in a parallel plate plasma enhanced chemical vapor deposition ("PECVD") reactor as well as a method for fabricating an ultralow k material for use in electronic structures as an intralevel or interlevel dielectric in a back-end-of-the-line ("BEOL") interconnect structure.

The present invention, in another aspect, also provides a thermally stable ultralow k material that has low internal stresses and a dielectric constant of not higher than about 2.5. More preferably, the dielectric constant for the ultralow k material is from about 1.5 to about 2.5 and, most preferably, the dielectric constant is from about 1.8 to about 2.25.

In yet another aspect, the present invention provides an electronic structure incorporating layers of insulating materials as intralevel or interlevel dielectrics in a back-end-of-the-line ("BEOL") wiring structure in which at least two of the layers of insulating materials comprise an ultralow k material of the present invention.

Still further, the present invention provides an electronic structure, which has layers of the inventive ultralow k material as intralevel or interlevel dielectrics in a back-end-of-the-line ("BEOL") wiring structure and which further contains at least one dielectric cap layer as a reactive ion etch ("RIE") stop or a chemical-mechanical polish stop or a diffusion barrier.

In accordance with the present invention, a method for fabricating a thermally stable dielectric material that has a matrix comprising Si, C, O, and H atoms and an atomic level nanoporosity is provided. In a preferred embodiment, the dielectric material has a matrix that consists essentially of Si, C, O, and H. The present invention further provides a method for fabricating the dielectric material by reacting a first silicon-containing precursor gas comprising atoms of Si, C, O, and H and at least a second organic-containing precursor gas comprising atoms of C, H, and optionally O, F and N in a plasma enhanced chemical vapor deposition ("PECVD") reactor. The dielectric material of the present invention has an FTIR spectra having a Si—O absorption band that can be deconvoluted into three peaks. The present invention further provides an electronic structure (i.e., substrate) that has layers of insulating materials as intralevel or interlevel dielectrics used in a back-end-of-the-line ("BEOL") wiring structure, wherein the insulating material can be the ultralow k film of present invention.

In a preferred embodiment, there is provided a method for fabricating a thermally stable ultralow k film comprising the steps of: providing a plasma enhanced chemical vapor deposition ("PECVD") reactor; positioning an electronic structure (i.e., substrate) in the reactor; flowing a first silicon-containing precursor gas comprising atoms of Si, C, O, and H into the reactor; flowing a second organic-containing precursor gas mixture comprising atoms of C, H and optionally O, F and N into the reactor; and depositing an ultralow k film on the substrate.

Preferably, the first precursor is selected from silane ($SiH_4$) derivatives having the molecular formula $SiRR'R''R'''$ where R,R',R", and R''' may or may not be identical and are selected from H, alkyl, and alkoxy, preferably methyl, ethyl, methoxy, and ethoxy. Preferred precursors include: diethoxydimethylsilane, diethoxymethylsilane (DEMS), ethoxyltrimethylsilane, ethoxydimethylsilane, dimethoxydimethylsilane, dimethoxymethylsilane, triethoxysilane and trimethoxymethylsilane.

The second precursor employed in the present application is an organic compound selected from:

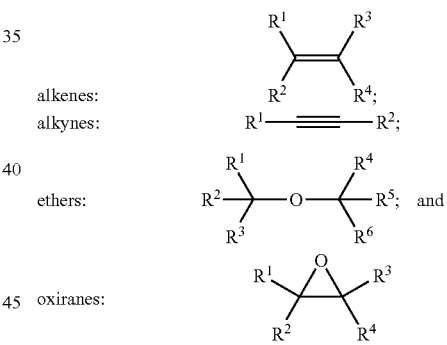

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents. Preferred second precursors include, ethylene oxide, propylene oxide, cyclopentene oxide, isobutylene oxide, 2,2,3-trimethyloxirane, butadienemonoxide, bicycloheptadiene (also known as 2,5-norbornadiene), 1,2-epoxy-5-hexene, 2-methyl-2-vinyloxirane, 1-isopropyl-cyclohexa-1,3-diene and tertbutylmethylether.

Optionally, the deposited film of the present invention can be heat treated at a temperature of not less than about 300° C. for a time period of at least about 0.25 hour. Alternatively the deposited film of the present invention can be UV or e-beam treated, as described, for example, in U.S. patent application Ser. No. 10/758,724, the content of which is incorporated herein by reference.

The inventive method may further comprise the step of providing a parallel plate reactor, which has a area of a substrate chuck between about 300 cm² and about 800 cm², and a gap between the substrate and a top electrode between about 1 cm and about 10 cm.

Alternatively, a multi-station reactor can also be employed for the film deposition. A high frequency RF power is applied to one of the electrodes at a frequency between about 12 MHz and about 15 MHz. Optionally, an additional low frequency power, for example at 2 MHz or lower frequency (350–450 KHz), can be applied to one of the electrodes.

The heat-treating step may further be conducted at a temperature not higher than about 300° C. for a first time period and then at a temperature not lower than about 380° C. for a second time period, the second time period being longer than the first time period. The second time period may be at least about 10 times the first time period. The thermally treated film may optionally be treated by exposure to UV radiation or e-beam, such as described in U.S. patent application Ser. No. 10/758,724.

The deposition step for the ultralow k film of the present invention may further comprise the steps of: setting the substrate temperature at between about 25° C. and about 400° C.; setting the high frequency RF power density at between about 0.05 W/cm² and about 3.5 W/cm²; setting the first precursor flow rate at between about 5 sccm and about 1000 sccm; setting the flow rate of the second precursor between about 5 sccm and about 1000 sccm; setting the carrier gas (He) flow rate at between 0 sccm and 1000 sccm; and setting the reactor pressure at a pressure between about 50 mtorr and about 8000 mtorr. Optionally, an ultralow frequency power may be added to the plasma between about 10 W and about 300 W.

In another preferred embodiment, there is provided a method for fabricating an ultralow k film comprising the steps of: providing a parallel plate type chemical vapor deposition reactor that has plasma enhancement; positioning a pre-processed wafer on a substrate chuck which has a area of between about 300 cm² and about 800 cm² and maintaining a gap between the wafer and a top electrode between about 1 cm and about 10 cm; flowing a first precursor gas comprising silane derivative molecules having the molecular formula SiRR'R"R'" wherein R, R', R" and R'" are the same or different and are selected from H, alkyl, and alkoxy, where R, R', R" and R'" are each independently of one other methyl, ethyl, methoxy or ethoxy, into the reactor; flowing at least a second precursor gas comprising organic molecules from the group of compounds including

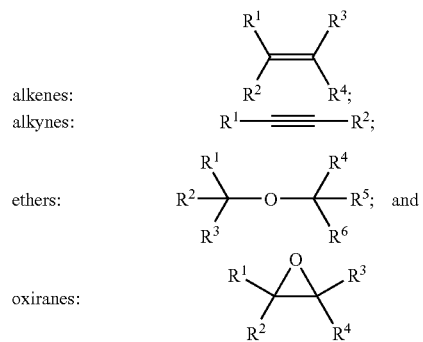

where $R^1$, $R^2$, $R^3$, $R^4$, $R^5$ and $R^6$ may or may not be identical and are selected from hydrogen, alkyl, alkenyl or alkynyl groups that may be linear, branched, cyclic, poly-cyclic and may be functionalized with oxygen, nitrogen or fluorine containing substituents; and depositing an ultralow k film on the wafer.

The process may further comprise the step of heat-treating the film after the deposition step at a temperature of not less than about 300° C. for at least about 0.25 hour or the step of UV or e-beam treating the film after the deposition. The process may further comprise the step of applying a RF power to the wafer. The heat-treating step may further be conducted at a temperature of not higher than about 300° C. for a first time period and then at a temperature not lower than about 380° C. for a second time period, the second time period being longer than the first time period. The second time period may be at least about 10 times the first time period.

The silane derivative precursor utilized can be diethoxymethylsilane (DEMS) and the organic precursor can be bicycloheptadiene (BCHD). The deposition step for the ultralow k film may further comprise the steps of: setting the wafer temperature at between about 25° C. and about 400° C.; setting a RF power density at between about 0.05 W/cm² and about 3.5 W/cm²; setting the flow rate of the silane derivative between about 5 sccm and about 1000 sccm; setting the flow rate of the organic precursor between about 5 sccm and about 1000 sccm; setting the carrier gas (He) flow rate at between 0 sccm and 1000 sccm; and setting the pressure reactor at between about 50 mtorr and about 8000 mtorr. Additionally, the deposition step may further comprise setting a flow ratio of bicycloheptadiene to diethoxymethylsilane to between about 0.1 and about 3, preferably between 0.2 and 0.6. The conductive area of the substrate chuck can be changed by a factor X, which leads to a change in RF power by the same factor X.

In still another preferred embodiment, there is provided a method for fabricating a thermally stable ultralow k dielectric film comprising the steps of: providing a plasma enhanced chemical vapor deposition reactor of a parallel plate type; positioning a wafer on a substrate chuck that has a conductive area between about 300 cm² and about 800 cm² and maintaining a gap between the wafer and a top electrode between about 1 cm and about 10 cm; flowing a precursor gas mixture of the foregoing mentioned silane derivative with an organic molecule into the reactor over the wafer, which is kept at a temperature between about 25° C. and about 400° C., at a total flow rate between about 25 sccm and about 1000 sccm while keeping the reactor pressure at between about 100 mtorr and about 8000 mtorr; depositing a dielectric film on the wafer under a RF power density between about 0.25 W/cm² and about 3 W/cm²; and optionally annealing the ultralow k film at a temperature of not less than about 300° C. for at least about 0.25 hour.

The inventive method may further comprise the step of annealing the film at a temperature of not higher than about 300° C. for a first time period and then at a temperature not lower than about 380° C. for a second time period, wherein the second time period is longer than the first time period. The second time period may be set at least about 10 times the first time period. The silane derivative can be diethoxymethylsilane (DEMS) and the organic precursor can be bicycloheptadiene (BCHD).

The present invention is further directed to an electronic structure which has layers of insulating materials as intralevel or interlevel dielectrics in a back-end-of-the-line ("BEOL") interconnect structure which includes a pre-processed semiconducting substrate that has a first region of metal embedded in a first layer of insulating material, a first region of conductor embedded in a second layer of insulating material of the inventive ultralow k dielectric which comprises Si, C, O and H, and a multiplicity of nanometer-sized pores, and having a dielectric constant of not more than about 2.5, the second layer of insulating material being in intimate contact with the first layer of insulating material, the first region of conductor being in electrical communication with the first region of metal, and a second region of conductor being in electrical communication with the first region of conductor and being embedded in a third layer of insulating material comprising the inventive ultralow k dielectric, the third layer of insulating material being in intimate contact with the second layer of insulating material. The electronic structure may further comprise a dielectric cap layer situated in-between the second layer of insulating material and the third layer of insulating material. The electronic structure may further comprise a first dielectric cap layer between the second layer of insulating material and the third layer of insulating material, and a second dielectric cap layer on top of the third layer of insulating material.

The dielectric cap material can be selected from silicon oxide, silicon nitride, silicon oxynitride, silicon carbon nitride (SiCN), silicon carbon oxynitride (SiCON), refractory metal silicon nitride (wherein the refractory metal is selected from the group consisting of Ta, Zr, Hf and W), silicon carbide, carbon doped oxide or SiCOH and their hydrogenated compounds. The first and the second dielectric cap layers may be selected from the same group of dielectric materials. The first layer of insulating material may be silicon oxide or silicon nitride or doped varieties of these materials, such as phosphorus silicate glass ("PSG") or boron phosphorus silicate glass ("BPSG"). The electronic structure may further include a diffusion barrier layer of a dielectric material deposited on at least one of the second and third layers of insulating material. The electronic structure may further comprise a dielectric on top of the second layer of insulating material, which acts as a reactive ion etch ("RIE") hard mask and polish stop layer and a dielectric diffusion barrier layer on top of the dielectric RIE hard mask and polish stop layer. The electronic structure may further comprise a first dielectric RIE hard mask/polish-stop layer on top of the second layer of insulating material, a first dielectric RIE hard mask/diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer. The electronic structure may further comprise a dielectric cap layer of same materials as mentioned above, between an interlevel dielectric of ultralow k dielectric and an intralevel dielectric of ultralow k dielectric.

BRIEF DESCRIPTION OF THE DRAWINGS

The foregoing objects, features and advantages of the present invention will become apparent from the following detailed description and the appended drawings in which.

DETAILED DESCRIPTION OF THE INVENTION

Figure 1:
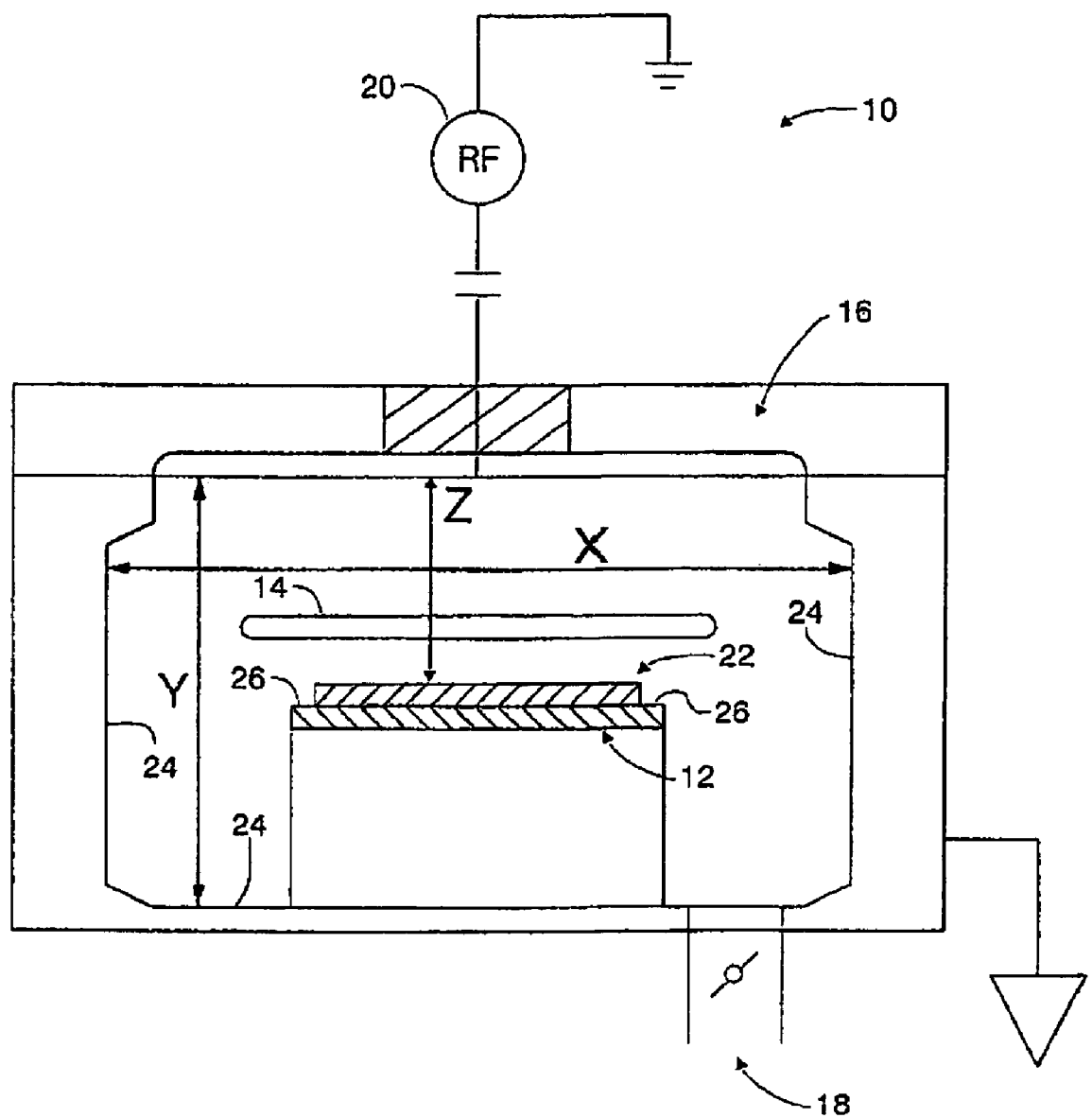
FIG. 1 depicts a cross-sectional view of a parallel plate chemical vapor deposition reactor that can be employed in the present invention.

The present invention discloses a method for fabricating a thermally stable ultralow dielectric constant film in a parallel plate plasma enhanced chemical vapor deposition ("PECVD") reactor. The material disclosed in the preferred embodiment contains a matrix of a hydrogenated oxidized silicon carbon material (SiCOH) comprising Si, C, O and H in a random covalently bonded network and having a dielectric constant of not more than about 2.5, which may further contain molecular scale voids, approximately 0.5 to 20 nanometer in diameter, further reducing the dielectric constant to values below about 2.0. More preferably, the dielectric constant for the ultralow k film is from about 1.5 to about 2.5, and most preferably the dielectric constant is from about 1.8 to about 2.25. The ultralow k dielectric material of the present invention is typically characterized as a multiphase film that includes a first phase consists essentially of Si, C, O and H and at a second phase that consists essentially of C and H, and a multiplicity of nanometer-sized pores.

To produce an ultralow k thermally stable film, a specific geometry of the deposition reactor with specific growth conditions is necessary. For instance, in the parallel plate reactor, a conductive area of the substrate chuck should be between about 300 cm$^2$ and about 800 cm$^2$, with a gap between the substrate and a top electrode between about 1 cm and about 10 cm. A RF power is applied to the substrate. In accordance with the present invention, the ultralow k film is formed from a mixture of a silane derivative such as DEMS and a second precursor, which is an organic molecule, selected from the group of compounds including alkenes: 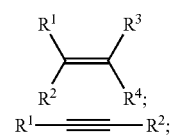

alkynes: $R^1 \equiv\!\!\equiv\!\!\equiv R^2$;

ethers: 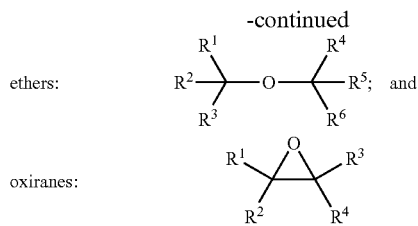 and oxiranes:

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents, such as bicycloheptadiene (BCHD), in a specifically configured deposition reactor under specific reaction conditions. The ultralow k film of the present invention can further be heat treated at a temperature not less than about 300° C. for at least about 0.25 hour or to reduce the dielectric constant. The film can also be UV or e-beam treated after deposition or after the thermal heat treatment. During this post-deposition treatment step, molecule fragments derived from the second precursor gas (or gas mixture) comprising carbon and hydrogen and optionally oxygen atoms may thermally decompose and may be converted into smaller molecules which are released from the film. Optionally, further development of voids may occur in the film by the process of conversion and release of the molecule fragments. The film density is thus decreased, with corresponding decrease in dielectric constant and refractive index.

The present invention provides a method for preparing a material that has an ultralow k, i.e., lower than about 2.5, which is suitable for integration in a BEOL wiring structure. More preferably, the dielectric constant for the inventive ultralow k film is from about 1.5 to about 2.5 and, most preferably, the dielectric constant is from about 1.8 to about 2.25. The inventive films can be prepared by choosing at least two suitable precursors and a specific combination of processing parameters as described herein below. Preferably, the first precursor is selected from silane ($SiH_4$) derivatives having the molecular formula $SiRR'R''R'''$ where R,R',R'', and R''' may or may not be identical and are selected from H, alkyl, and alkoxy, preferably methyl, ethyl, methoxy, and ethoxy. Preferred precursors include: diethoxydimethylsilane, diethoxymethylsilane (DEMS), ethoxyltrimethylsilane, ethoxydimethylsilane, dimethoxydimethylsilane, dimethoxymethylsilane, triethoxysilane, and trimethoxymethylsilane.

The second precursor employed in the present application is an organic compound selected from:

alkenes: 
alkynes: $R^1 \equiv\!\!\equiv\!\!\equiv R^2$;
ethers: 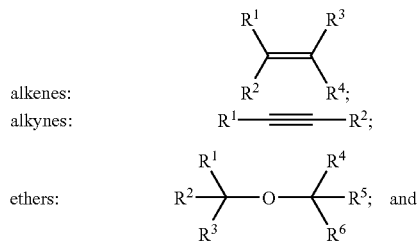 and oxiranes:

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents. Additionally, other atoms such as S, Si, or other halogens may be contained in the second precursor molecule. Of these species, the most suitable are ethylene oxide, propylene oxide, cyclopentene oxide, isobutylene oxide, 2,2,3-trimethyloxirane, butadienemonoxide, bicycloheptadiene, 1,2-epoxy-5-hexene, 2-methyl-2-vinyloxirane, 1-isopropyl-cyclohexa-1,3-diene and tertbutylmethylether.

As shown in FIG. 1, parallel plate plasma enhanced chemical vapor deposition ("PECVD") reactor 10 is the type used for processing 200 mm wafers. The inner diameter, X, of the reactor 10 is approximately 13 inches, while its height, Y, is approximately 8.5 inches. The diameter of substrate chuck 12 is approximately 10.8 inches. Reactant gases are introduced into reactor 10 through a gas distribution plate ("GDP") 16 that is spaced apart from substrate chuck 12 by a gap Z of about 1 inch, and are exhausted out of reactor 10 through a 3-inch exhaust port 18. RF power 20 is connected to GDP 16, which is electrically insulated from reactor 10, and substrate chuck 12 is grounded. For practical purposes, all other parts of the reactor are grounded. In a different embodiment, RF power 20 can be connected to substrate chuck 12 and transmitted to substrate 22. In this case, the substrate acquires a negative bias, whose value is dependent on the reactor geometry and plasma parameters. In another embodiment, more than one electrical power supply can be used. For instance, two power supplies can operate at the same RF frequency, or one may operate at a low frequency and one at a high frequency. The two power supplies may be connected both to the same electrode or to separate electrodes. In another embodiment, the RF power supply can be pulsed on and off during deposition. Process variables controlled during deposition of the low-k films are RF power density, precursor mixture and flow rate, pressure in reactor, electrode spacing, and substrate temperature. (The temperature of the heated wafer chuck controls the substrate temperature.)

In accordance with the present invention, suitable first and second precursors and specific combination of processing parameters described herein above are employed such that the inventive ultralow k material prepared preferably comprises: between about 5 and about 40 atomic percent of Si; between about 5 and about 70 atomic percent of C; between 0 and about 50 atomic percent of O; and between about 5 and about 55 atomic percent of H. In some embodiments of the present invention, the C content could be as high as about 70%.

The main process variables controlled during a deposition process for a film are the RF power, the flow rates of the precursors, the reactor pressure and the substrate temperature. Provided herein below are several examples of deposition of films from a first precursor diethoxymethylsilane (DEMS) and a second precursor bicycloheptadiene (BCHD) according to the present invention. In some examples, the DEMS precursor vapors were transported into the reactor by using He (or Ar) as a carrier gas. Optionally, the films were heat treated at 400° C. after deposition to reduce k. Alternatively the films were UV or e-beam treated to reduce k and increase cross-linking, as described, for example, in U.S. application Ser. No. 10/758,724. The heat treatment can be used alone or in conjunction with one of treatment methods disclosed in the '724 application.

Specifically, the as deposited film can be optionally treated using an energy source, in accordance with the '724 application, to stabilize the film and improve its properties (electrical, mechanical, adhesive), resulting in a final optimum film. Suitable energy sources include thermal, chemical, ultraviolet (UV) light, electron beam (e-beam), microwave, and plasma. Combinations of the aforementioned energy sources can also be used in the present invention. The energy sources employed in the present invention are utilized to modify the Si—O bonding network of the as deposited dielectric, modify other bonds in the material, cause more Si—O cross-linking, and in some cases to remove the hydrocarbon phase, with all of the aforementioned modifications resulting in a higher elastic modulus, a higher hardness, or a lower internal stress, or a combination of said properties. Either a higher modulus or a lower stress results in a lower crack propagation velocity, with the combination of higher modulus and lower stress being a preferred result of the energy treatment.

The thermal energy source includes any source such as, for example, a heating element or a lamp, that can heat the deposited dielectric material to a temperature from about 300° to about 500° C. More preferably, the thermal energy source is capable of heating the deposited dielectric material to a temperature from about 350° to about 430° C. This thermal treatment process can be carried out for various time periods, with a time period from about 1 minute to about 300 minutes being typical. The thermal treatment step is typically performed in the presence of an inert gas such as He and Ar. The thermal treatment step may be referred to as an anneal step in which rapid thermal anneal, furnace anneal, laser anneal or spike anneal conditions are employed.

The UV light treatment step is performed utilizing a source that can generate light having a wavelength from about 500 to about 150 nm, to irradiate the substrate while the wafer temperature is maintained at 25° to 500° C., with temperatures from 300°–450° C. being preferred. Radiation with >370 nm is of insufficient energy to dissociate or activate important bonds, so the wavelength range 150–370 nm is a preferred range. Using literature data and absorbance spectra measured on as deposited films, the inventors have found that <170 nm radiation may not be favored due to degradation of the SiCOH film. Further, the energy range 310–370 nm is less useful than the range 150–310 nm, due to the relatively low energy per photon from 310–370 nm. Within the 150–310 nm range, optimum overlap with the absorbance spectrum of the as deposited film and minimum degradation of the film properties (such as hydrophobicity) may be optionally used to select a most effective region of the UV spectrum for changing the SiCOH properties.

The electron beam treatment step is performed utilizing a source that is capable of generating a uniform electron flux over the wafer, with energies from 0.5 to 25 keV and current densities from 0.1 to 100 microAmp/cm$^2$ (preferably 1 to 5 microAmp/cm$^2$), while the wafer temperature is maintained at 25° to 500° C., with temperatures from 300°–450° C. being preferred. The preferred dose of electrons used in the electron beam treatment step is from 50 to 500 microcoulombs/cm$^2$, with 100 to 300 microcoulombs/cm$^2$ being most preferred.

The plasma treatment step is performed utilizing a source that is capable of generating atomic hydrogen (H), and optionally CH$_3$ or other hydrocarbon radicals. Downstream plasma sources are preferred over direct plasma exposure. During plasma treatment the wafer temperature is maintained at 25° to 500° C., with temperatures from 300°–450° C. being preferred.

The plasma treatment step is performed by introducing a gas into a reactor that can generate a plasma and thereafter it is converted into a plasma. The gas that can be used for the plasma treatment includes inert gases such as Ar, N, He, Xe or Kr, with He being preferred; hydrogen or related sources of atomic hydrogen, methane, methylsilane, related sources of CH$_3$ groups, and mixtures thereof. The flow rate of the plasma treatment gas may vary depending on the reactor system being used. The chamber pressure can range anywhere from 0.05 to 20 torr, but the preferred range of pressure operation is 1 to 10 torr. The plasma treatment step occurs for a period of time, which is typically from about ½ to about 10 minutes, although longer times may be used within the invention.

An RF or microwave power source is typically used to generate the above plasma. The RF power source may operate at either the high frequency range (on the order of about 100 W or greater); the low frequency range (less than 250 W) or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.1 to 1.0 W/cm$^2$ but the preferred range of operation is 0.2 to 0.5 W/Cm$^2$. The chosen power levels must be low enough to avoid significant sputter etching of the exposed dielectric surface (<5 nanometers removal).

The deposition conditions utilized are also critical to enable a successful implementation of the deposition process according to the present invention. For instance, a wafer temperature of between about 25° C. and about 420° C., and preferably of between about 60° C. and about 350° C. is utilized. A RF power density between about 0.05 W/cm$^2$ and about 3.5 W/cm$^2$, and preferably between about 0.25 W/cm$^2$ and about 1 W/cm$^2$ is utilized. In the preferred process, radio frequency energy is applied to both the gas introduction plate ("showerhead") at a frequency of 13.6 MHz and a power of about 350 W (although 200–450 W may be used), and also to the wafer chuck at a frequency of 13.6 MHz and a power of about 100 W (although 50–200 W may be used). As is known in the art, different RF frequencies (0.26, 0.35, 0.45 MHz) may also be used in the present invention.

A reactant gas flow rate of DEMS between about 5 sccm and about 1000 sccm, and preferably between about 25 sccm and about 200 sccm is utilized. A reactant gas flow rate of BCHD between about 5 sccm and about 1000 sccm, and preferably between about 10 sccm and about 120 sccm is utilized. When liquid precursor delivery is used, a liquid flow rate is used in the range of 500–5000 mg/minute for each of the precursors. Optionally, He may be added and the preferred He flow is in the range 100–2000 sccm, although other flows may be used within the invention. Reactor pressure during the deposition process is typically between about 50 mtorr and about 10000 mtorr.

If a multistation deposition reactor is used, the area of the substrate refers to each individual substrate chuck and the flow rates of the gases refer to one individual deposition station. Accordingly, total flow rates and total power input to the reactor are multiplied by a total number of deposition stations inside the reactor.

The deposited films are stabilized before undergoing further integration processing. The stabilization process can be performed in a furnace-annealing step at about 300° C. to about 430° C. for a time period between about 0.5 hours and about 4 hours. The stabilization process can also be performed in a rapid thermal annealing process at temperatures above about 300° C. The stabilization process can also be performed in a UV or e-beam chamber at temperatures above 300° C. The dielectric constants of the films obtained according to the present invention are lower than about 2.5. The thermal stability of the films obtained according to the present invention in a non-oxidizing ambient is up to at least a temperature of about 430° C.

The electronic devices formed according to the present invention are shown in FIGS. 4–7. It should be noted that the devices shown in FIGS. 4–7, are merely illustrated as examples according to the present invention, while countless other devices can also be formed according to the present invention.

Figure 4:
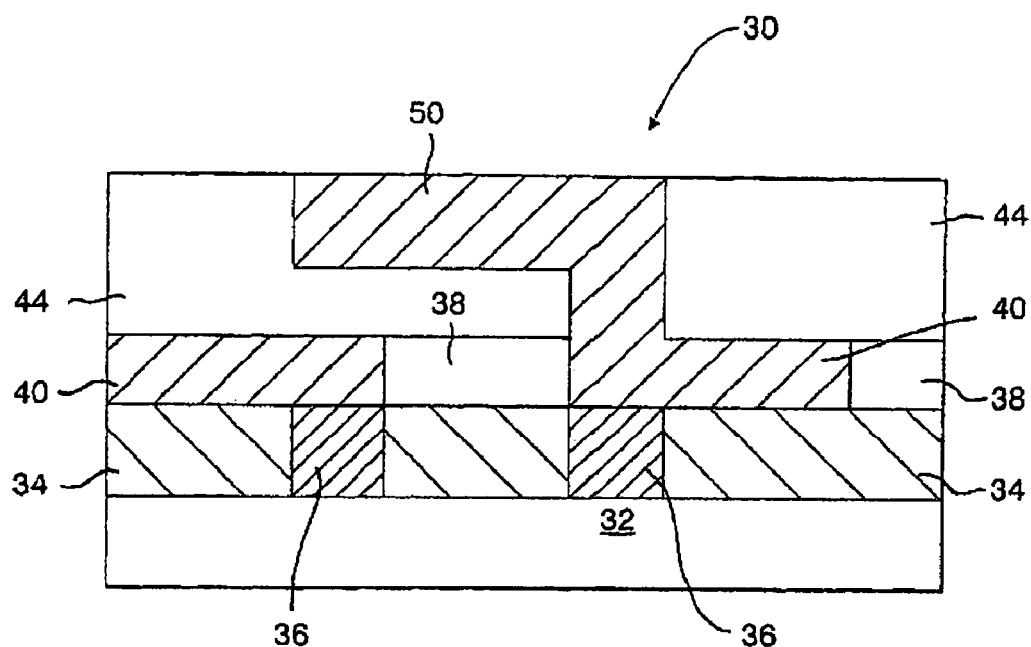
FIG. 4 depicts an enlarged, cross-sectional view of an electronic device having an intralevel dielectric layer and an interlevel dielectric layer of ultralow k material according to the present invention.

FIG. 4 depicts electronic device 30 that is built on a silicon substrate 32. On top of silicon substrate 32, insulating material layer 34 is formed with a first region of metal 36 embedded therein. After a chemical mechanical polishing ("CMP") process is conducted on first region of metal 36, a film such as an ultralow k film 38 is deposited on top of first layer of insulating material 34 and first region of metal 36. Optionally, an additional dielectric cap layer (not shown) may be added between layer 34 and layer 38. First layer of insulating material 34 may be suitably formed of silicon oxide, silicon nitride, doped varieties of these materials, or any other suitable insulating materials. Ultralow k film 38 is patterned by a photolithography process and conductor layer 40 is deposited therein. After a CMP process on first conductor layer 40 is carried out, second layer of ultralow k film 44 is deposited by a plasma enhanced chemical vapor deposition ("PECVD") process overlying first ultralow k film 38 and first conductor layer 40. Conductor layer 40 may be deposited of a metallic conductive material or a non-metallic conductive material. For instance, a metallic conductive material of aluminum or copper, or a non-metallic material such as nitride or polysilicon may be utilized. First conductor 40 is in electrical communication with first region of metal 36.

A second region of conductor 50 is formed, after a photolithographic process in second ultralow k film layer 44 is conducted, followed by a deposition process for the second conductor material. Second conductor 50 may also be deposited of either a metallic material or a non-metallic material, similar to that used in depositing the first conductor layer 40. The second region of conductor 50 is in electrical communication with the first region of conductor 40 and is embedded in the second layer of ultralow k insulator 44. The second layer of ultralow k film is in intimate contact with the first layer of insulating material 38. In this specific example, the first layer of insulating material 38, which is an ultralow k material according to the present invention, serves as an intralevel dielectric material, while the second layer of insulating material, i.e., the ultralow k film 44, serves as both an intralevel and an interlevel dielectric. Based on the low dielectric constant of the ultralow k film, superior insulating property can be achieved by first insulating layer 38 and second insulating layer 44.

Figure 5:
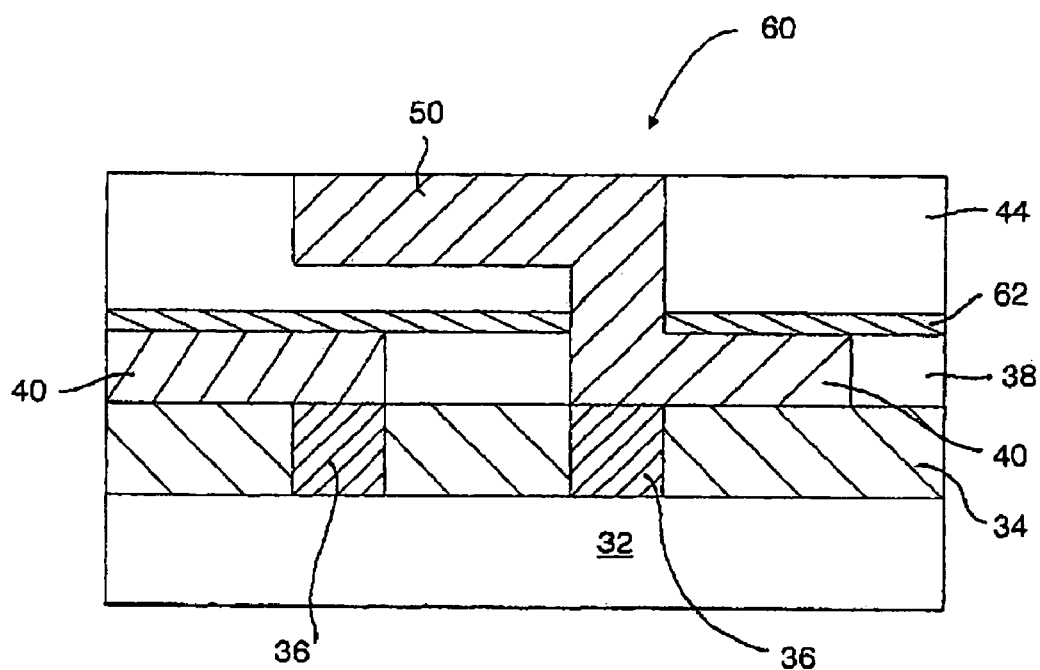
FIG. 5 depicts an enlarged, cross-sectional view of the electronic structure of FIG. 4 having an additional diffusion barrier dielectric cap layer on top of ultralow k material film according to the present invention.

FIG. 5 depicts electronic device 60 according to the present invention, similar to that of electronic device 30 shown in FIG. 4, but with additional dielectric cap layer 62 deposited between first insulating material layer 38 and second insulating material layer 44. Dielectric cap layer 62 can be suitably formed of a material such as silicon oxide, silicon nitride, silicon oxynitride, silicon carbide, silicon carbon nitride (SiCN) silicon carbo-oxide (SiCO), modified ultralow k and their hydrogenated compounds, as well as refractory metal silicon nitride, wherein the refractory metal is selected the group consisting of: Ta, Zr, Hf, and W. Additionally dielectric cap layer 62 functions as a diffusion barrier layer for preventing diffusion of first conductor layer 40 into second insulating material layer 44 or into the lower layers, especially into layers 34 and 32.

Figure 6:
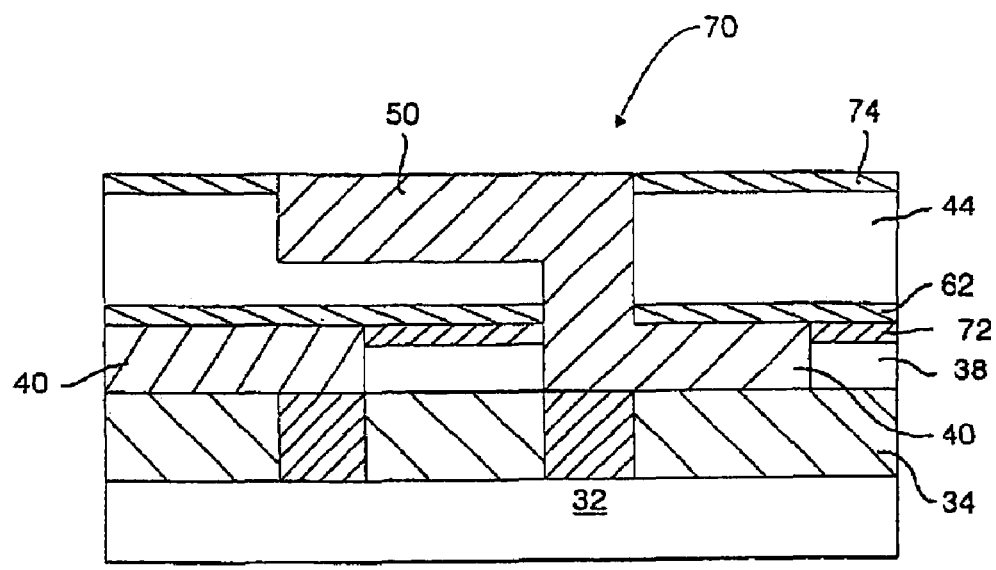
FIG. 6 depicts an enlarged, cross-sectional view of the electronic structure of FIG. 5 having an additional RIE hard mask/polish-stop dielectric cap layer and dielectric cap diffusion barrier on top of the polish-stop layer according to the present invention.

FIG. 6 depicts another alternate embodiment of electronic device 70 according to the present invention. In electronic device 70, two additional dielectric cap layers 72 and 74 that act as an RIE mask and CMP (chemical-mechanical polishing) polish stop layer are used. First dielectric cap layer 72 is deposited on top of first insulating material layer 38. The function of dielectric layer 72 is to provide an end point for the CMP process utilized in planarizing first conductor layer 40. Polish stop layer 72 can be deposited of a suitable dielectric material such as silicon oxide, silicon nitride, silicon oxynitride, silicon carbide, silicon carbo-oxide (SiCO), silicon carbon nitride (SCN) modified ultralow k and their hydrogenated compounds, as well as refractory metal silicon nitride, wherein the refractory metal is selected from the group consisting of: Ta, Zr, Hf and W. The top surface of dielectric layer 72 is at the same level as first conductor layer 40. A second dielectric layer 74 can be added on top of second insulating material layer 44 for the same purposes.

Figure 7:
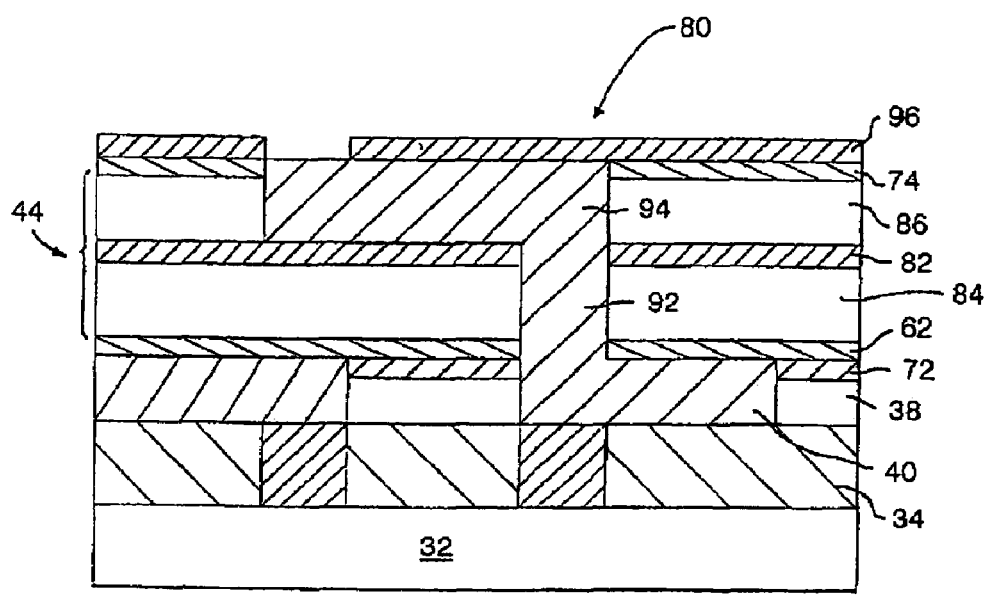
FIG. 7 depicts an enlarged, cross-sectional view of the electronic structure of FIG. 6 having additional RIE hard mask/polish-stop dielectric layers on top of the interlevel ultralow k material film according to the present invention.
Figure 8:
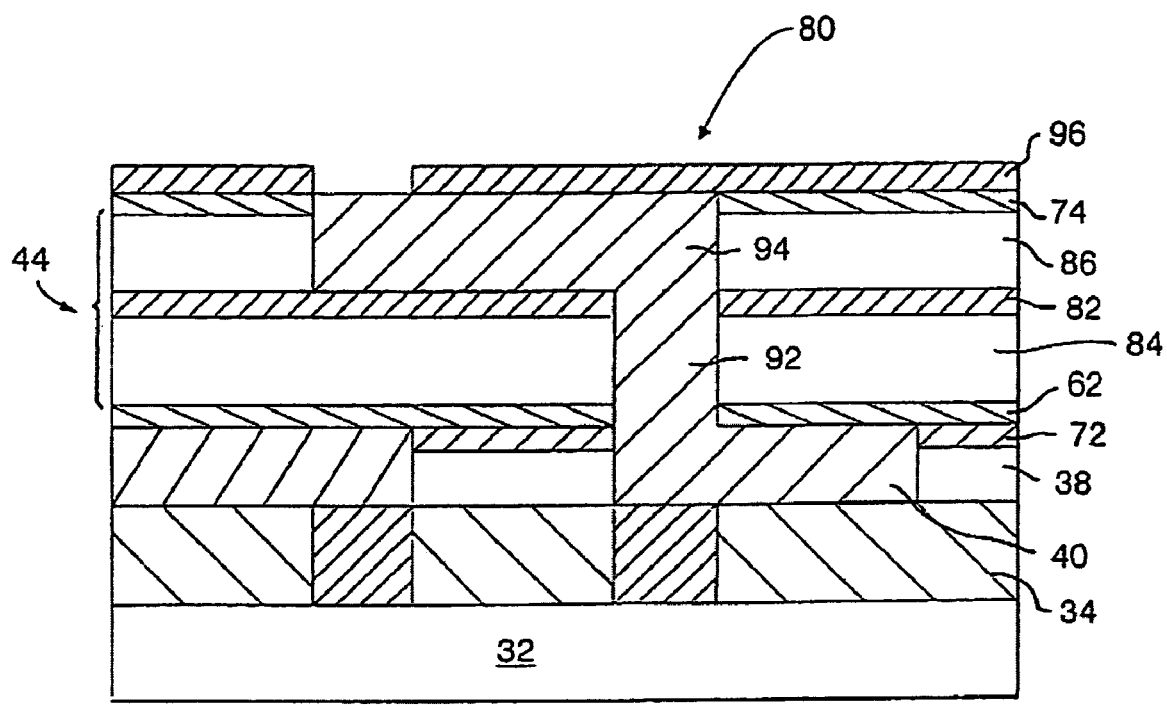
FIG. 8 is an enlarged, cross-sectional view of the present invention electronic structure of FIG. 7 having additional RIE hard mask/polish stop dielectric layers deposited on top of the multiphase material film.

FIG. 7 depicts still another alternate embodiment of electronic device 80 according to the present invention. In this alternate embodiment, an additional layer of dielectric 82 is deposited and thus divides second insulating material layer 44 into two separate layers 84 and 86. Intralevel and interlevel dielectric layer 44, as depicted in FIG. 7, is therefore divided into interlayer dielectric layer 84 and intralevel dielectric layer 86 at the boundary between interconnect 92 and interconnect 94, as depicted in FIG. 8. An additional diffusion barrier layer 96 is further deposited on top of the upper dielectric layer 74. The additional benefits provided by this alternate embodiment of the electronic structure 80 is that the dielectric layer 82 acts as a RIE etch stop providing superior interconnect depth control, and hence superior control over the conductor resistance.

The following examples are presented to illustrate the fabrication of the ultralow k dielectric film in accordance with the present invention as well as to demonstrate advantages that can be obtained therefrom:

EXAMPLE 1

In this example, according to FIG. 1, a wafer was first prepared by introducing the wafer into reactor 10 through a slit valve 14 and the wafer was optionally pre-etched by argon gas. In this wafer preparation process, the wafer temperature was set at about 180° C. and the argon flow rate was set at about 25 sccm, to achieve a pressure of about 100 mtorr. A RF power was then turned on to about 125 W for about 60 seconds. The RF power and the argon gas flow were then turned off.

The DEMS precursor was carried into the reactor. The ultralow k film according to the present invention was deposited by first establishing gas flows of DEMS and BCHD to desired flow rates and pressure, i.e., at about 4 sccm of DEMS and about 3 sccm of BCHD and about 500 mtorr. A RF power was then turned on at about 30 W for a time period of about 50 minutes. The RF power and the gas flow were then turned off. The wafer was then removed from reaction reactor 10.

To reduce the dielectric constant of the deposited films and to further improve their thermal stability, i.e., to make them stable at temperatures greater than 300° C., the films were post treated to evaporate the volatile contents and to dimensionally stabilize the films. The post treatment process can be carried out in an annealing furnace by the following steps. The furnace was first purged for about 5 minutes (with the film samples in a load station) with nitrogen at a flow rate of about 10 liters/minute. The film samples were then transferred into the furnace reactor to start the post annealing cycle of heating the films to about 280° C. at a heating rate of about 5° C./minute, holding at about 280° C. for about 5 minutes, heating at a second heating rate of about 5° C./minute to about 400° C., holding at about 400° C. for about 4 hours, turning the furnace off and allowing the film samples to cool to a temperature of below about 100° C. A suitable first holding temperature may be between about 280° C. and about 300° C., while a suitable second holding temperature may be between about 300° C. and about 400° C. The films thus obtained have a dielectric constant of 1.81. Alternatively the film can be UV or e-beam treated at above 300° C. for up to 30 minutes.

Figure 2:
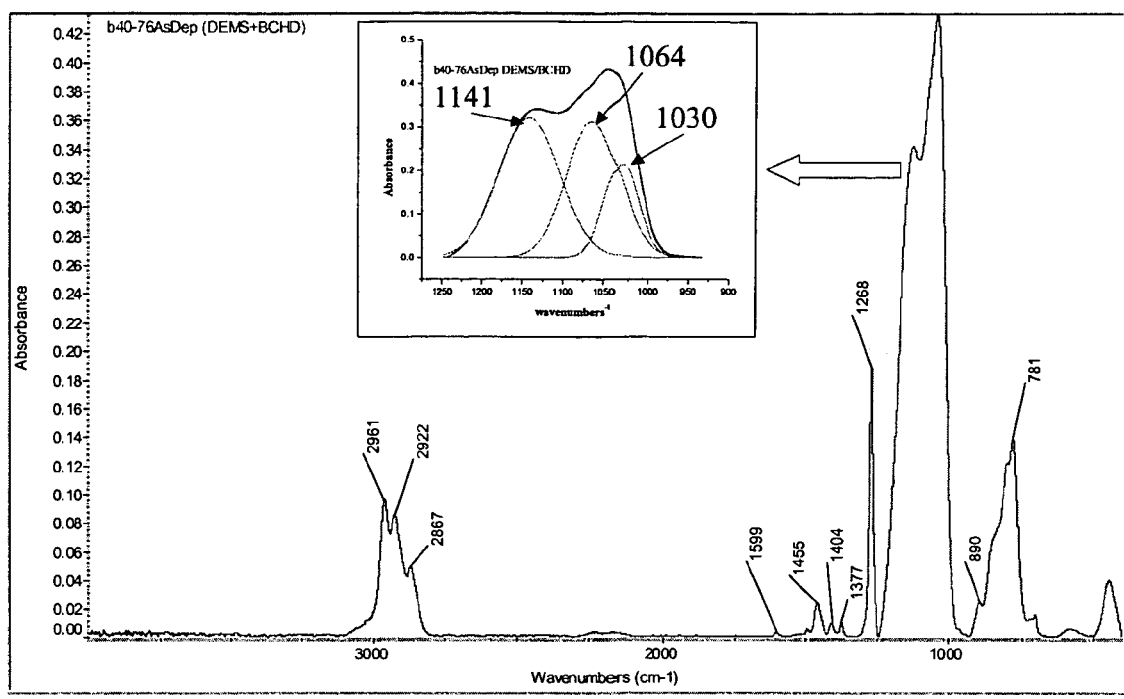
FIG. 2 depicts a Fourier Transform Infrared ("FTIR") spectrum obtained from an inventive ultralow k material deposited from a mixture of diethoxymethylsilane ("DEMS") and bicycloheptadiene ("BCHD").

Results of the first embodiment are now discussed in reference to FIG. 2. FIG. 2 presents the FTIR spectrum obtained from an ultralow k film prepared from a mixture of DEMS+BCHD in accordance with the present invention. The spectrum displays the Si—O absorption band at about 1000–1100 $cm^{-1}$, Si—$CH_3$ absorption peak at about 1268 $cm^{-1}$ and C—H absorption peaks at about 2900–3000 $cm^{-1}$. One characteristic of the FTIR spectrum of the ultralow k film is the Si—O peak can be deconvoluted into 3 peaks centered at 1141 $cm^{-1}$, 1064 $cm^{-1}$ and 1030 $cm^{-1}$, as particularly illustrated in FIG. 2.

EXAMPLE 2

In this example, a wafer was prepared in the same tool as in Example 1. The wafer was first introduced into the reaction chamber. The wafer temperature was set at about 180° C. The DEMS precursor was carried into the reactor. The ultralow k film according to the present invention was deposited by first establishing gas flows of DEMS and butadienemonoxide (BMO) to desired flow rates and pressure, i.e., at about 1 sccm of DEMS and about 4 sccm of BMO and about 500 mtorr. A RF power was then turned on at about 30 W for a time period of about 50 minutes. The RF power and the gas flow were then turned off. The wafer was then removed from reactor 10.

The film was then treated with the same method described in Example 1. The resulting film had a dielectric constant of 1.77.

EXAMPLE 3

In this example, a wafer was prepared in the same tool as in Example 1. The wafer was first introduced into the reaction chamber. The wafer temperature was set at about 180° C. The DEMS precursor was carried into the reactor. The ultralow k film according to the present invention was deposited by first establishing gas flows of DEMS and 2-methyl-2-vinyloxirane (MVOX) to desired flow rates and pressure, i.e., at about 2 sccm of DEMS and about 3 sccm of MVOX and about 500 mtorr. A RF power was then turned on at about 30 W for a time period of about 50 minutes. The RF power and the gas flow were then turned off. The wafer was then removed from reactor 10.

The film was then treated with the same method described in Example 1.

The resulting film had a dielectric constant of 2.08.

EXAMPLE 4

In this example, a wafer was prepared in an 8-inch commercial PECVD tool. The wafer was first introduced into the reaction chamber. The wafer temperature was set at about 200° C. Both DEMS and cyclopentene oxide (CPO) were carried into the reactor using He as a carrier gas. The ultralow k film according to the present invention was deposited by first establishing gas flows of DEMS and CPO and He to desired flow rates and pressure, i.e., at about 70 sccm of DEMS and about 320 sccm of CPO and about 300 sccm of He and about 2000 mtorr. A RF power was then turned on at about 300W for a time period of about 10 minutes. The RF power and the flow were then turned off. The wafer was then removed from the reaction chamber.

The film was then treated with the same method described in Example 1. The resulting film had a dielectric constant of 2.19.

Figure 3:
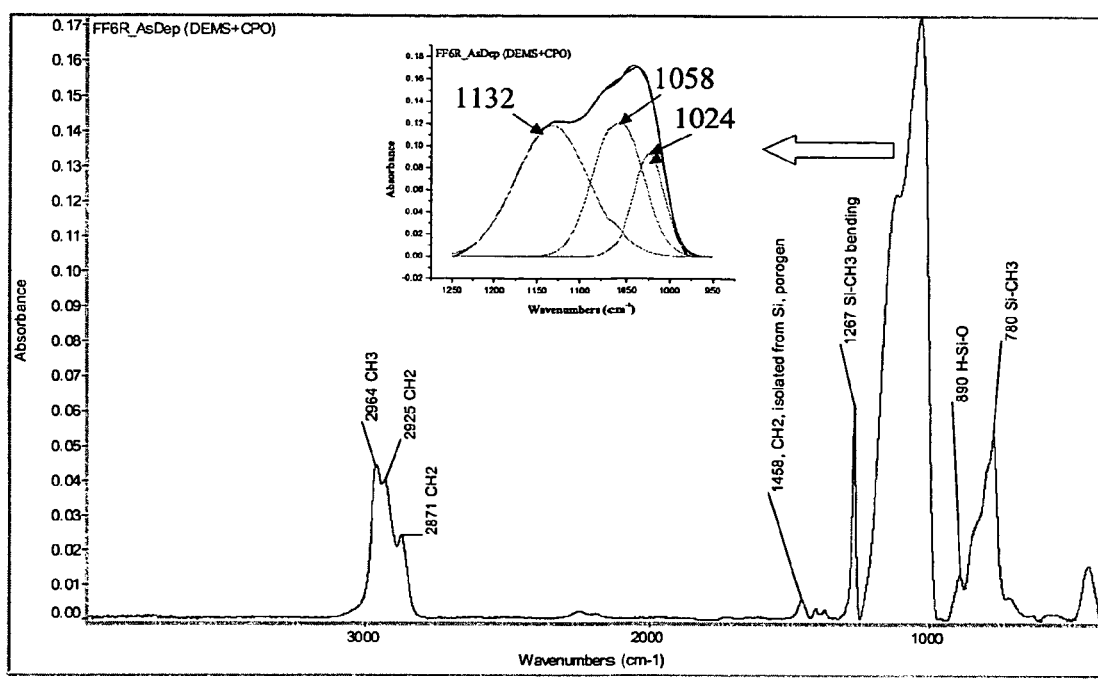
FIG. 3 depicts a Fourier Transform Infrared ("FTIR") spectrum obtained from another inventive ultralow k material deposited from a mixture of diethoxymethylsilane ("DEMS") and cyclopentene oxide ("CPO").

Results are now discussed in reference to FIG. 3. FIG. 3 presents the FTIR spectrum obtained from an ultralow k film prepared from DEMS/CPO and He. The spectrum displays the Si—O absorption band at about 1000–1100 $cm^{-1}$, Si—$CH_3$ absorption peak at about 1267 $cm^{-1}$ and C—H absorption peaks at about 2900–3000 $cm^{-1}$. One characteristic of the FTIR spectrum of the ultralow k film is the Si—O peak can be deconvoluted into 3 peaks centered at 1132 $cm^{-1}$, 1058 $cm^{-1}$ and 1024 $cm^{-1}$, as particularly illustrated in FIG. 3.

A rapid thermal annealing ("RTA") process may also be used to stabilize ultralow k films. The films obtained according to the present invention, are characterized by dielectric constants k less than about 2.5, and are thermally stable for integration in a back-end-of-the-line ("BEOL") interconnect structure, which is normally processed at temperatures of up to about 400° C. The teachings of the present invention can therefore be easily adapted in producing films as intralevel and interlevel dielectrics in back-end-of-the-line processes for logic and memory devices.

The method and electronic structures formed according to the present invention have therefore been thoroughly demonstrated in the above descriptions and in the appended drawings of FIGS. 4–8. It should be emphasized that the examples of the electronic structures shown in FIGS. 4–8 are merely used to illustrate the inventive method that can be applied in the fabrication of countless electronic devices.

As is known in the art, the gas flow units listed above in the 4 process examples may be replaced by liquid flow units when liquid mass flow control is used.

While the present invention has been described in an illustrative manner, it should be understood that the terminology used is intended to be in a nature of words of description rather than of limitation.

Furthermore, while the present invention has been particularly shown and described with respect to a preferred embodiment and several alternate embodiments, it is to be appreciated that those skilled in the art may readily apply these teachings to other possible variations of the present invention without departing from the spirit and scope of the present invention.

The embodiments of the present invention in which exclusive property or privilege is claimed are defined below in the appended claims.

What is claimed is:

1. A method for fabricating an ultralow dielectric constant film comprising the steps of:

flowing a first precursor gas having a linear molecular formula of SiRR'R"R'", where R,R',R", and R'" are the same or different and are selected from H, alkyl, and alkoxy into a chamber of a plasma enhanced chemical vapor deposition (PECVD) reactor;

flowing a second precursor gas having one of the following formulas alkenes:

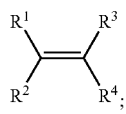

alkynes:

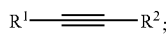

ethers:

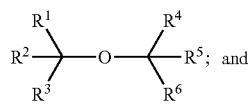

oxiranes:

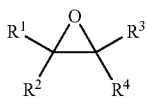

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents into said chamber; and depositing an ultralow k film from said precursor gases on a substrate.

2. The method of claim 1 wherein said ultralow k film is a multiphase film that comprises a first phase consisting essentially of Si, C, O and H and at least a second phase consisting essentially of C, H and a multiplicity of nanometer-sized pores on said substrate.

3. The method of claim 1 further comprising mixing an inert gas with one or both of said precursor gases.

4. The method of claim 1 further comprising heating said ultralow k film after deposition at a temperature not less than about 300° C. for at least about 0.25 hours.

5. The method of claim 1 further comprising treating said utralow k film after deposition with an energy source to stabilize the ultralow k film and improve its properties, said energy source comprising one of a thermal source, a chemical source, an ultraviolet (UV) light source, an electron beam (e-beam) source, a microwave source, or a plasma source.

6. The method of claim 1 wherein said ultralow k film has a dielectric constant of not more than about 2.5.

7. The method of claim 1 wherein said ultralow k film has a dielectric constant from about 1.5 to 2.5.

8. The method of claim 1 wherein said ultralow k film comprises about 5 to about 40 atomic percent of Si; about 5 to about 45 atomic percent of C; about 0 to about 50 atomic percent of O; and about 10 to about 55 atomic percent of H.

9. The method of claim 1 wherein said PECVD reactor has an area of a substrate chuck between about 300 $cm^2$ and about 800 $cm^{2}$, and a gap between the substrate and a top electrode between about 1 cm and about 10 cm.

10. The method of claim 1 further comprising the step of applying a RF power to an electrode of said PECVD reactor.

11. The method of claim 1 further comprising a step of UV or e-beam treating said ultralow k film at a temperature not lower than about 300° C for up to 30 minutes.

12. The method of claim 1 further comprising a step of a combination of heat treating and UV or e-beam treating said ultralow k film.

13. The method of claim 1 wherein said first precursor gas is diethoxymethylsilane (DEMS).

14. The method of claim 1 wherein said second precursor comprises bicycloheptadiene (BCHD), cyclopentene oxide (CPO), ethylene oxide, propylene oxide, isobutylene oxide, 2,2,3-trimethyloxirane, butadienemonoxide, 1,2-epoxy-5-hexene, 2-methyl-2-vinyloxirane, tertbutylmethylether, 1-isopropyl-cyclohexa-1,3-diene or mixtures thereof.

15. The method of claim 1 wherein said step of depositing the ultralow k film further comprises the steps of setting a temperature for said substrate at between about 25° C. and about 400° C.; and setting a RF power density at between about 0.05 $W/cm^2$ and about 3.5 $W/cm^2$.

16. The method of claim 1 wherein said step of depositing the ultralow k film further comprises setting a flow rate for said first precursor gas between about 5 sccm to about 1000 sccm, or between about 30 to about 6,000 mg/minute when liquid delivery is used.

17. The method of claim 16 wherein said flow rate for said first precursor gas is between about 25 sccm to about 200 sccm, or between about 150 to about 1200 mg/minute when liquid delivery is used.

18. The method of claim 1 wherein said step of depositing said ultralow k film further comprises setting a flow rate for said second precursor gas between about 5 sccm to about 1000 sccm, or between about 30 to about 6,000 mg/minute when liquid delivery is used.

19. The method of claim 18 wherein said flow rate for said second precursor gas is between about 25 sccm to about 200 sccm, or between about 150 to about 1200 mg/minute when liquid delivery is used.

20. The method of claim 1 wherein said step of depositing said ultralow k film further comprises setting a pressure for said PECVD reactor at between about 50 mtorr and about 10000 mtorr.

21. The method of claim 20 wherein said pressure for said PECVD reactor is between about 100 mtorr and about 5000 mtorr.

22. The method of claim 1 wherein said step of depositing said ultralow k film further comprises setting a flow rate ratio of bicycloheptadiene, as said second precursor gas, to diethoxymethylsilane, as said first precursor gas, to between about 0.1 and about 3.

23. The method of claim 22 wherein said flow rate ratio of said bicycloheptadiene to said diethoxymethylsilane is between about 0.2 and about 0.6.

24. The method of claim 1 wherein said PECVD reactor is run in a continuous mode.

25. The method of claim 1 wherein said PECVD reactor is run in a pulsed mode.

26. A method for fabricating a thermally stable ultralow k film comprising the steps of:

providing a plasma enhanced chemical vapor deposition (PECVD) reactor;

positioning a pre-processed wafer on a substrate chuck having an area between about 300 cm² and about 800 cm² and maintaining a gap between said wafer and a top electrode between about 1 cm and about 10 cm;

flowing a first precursor gas comprising linear silane derivative molecules into said PECVD reactor;

flowing at least a second precursor gas comprising a compound having one of the following formulas

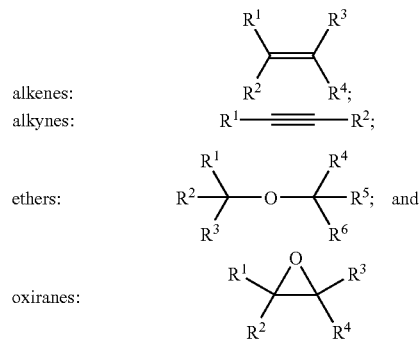

alkenes:

alkynes:

ethers: and oxiranes:

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents into said PECVD reactor, and depositing an ultralow k film on said wafer.

27. A method for fabricating a thermally stable ultralow k film comprising the steps of:

providing a plasma enhanced chemical vapor deposition (PECVD) reactor;

positioning a wafer on a substrate chuck having an area between about 300 cm² and about 800 cm², and maintaining a gap between the wafer and a top electrode between about 1 cm and about 10 cm;

flowing into said reactor over said wafer kept at a temperature between about 25° C. and about 400° C., a first precursor gas of a linear silane derivative at a flow rate between about 5 sccm and about 1000 sccm, and a second precursor gas at a flow rate between about 5 sccm and about 1000 sccm, while keeping a pressure in said reactor between about 50 mtorr and about 8000 mtorr, said second precursor gas comprising a compound having one of the following formulas

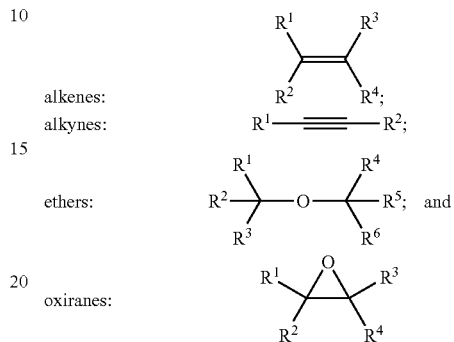

alkenes:

alkynes:

ethers: and oxiranes:

where $R^1$, $R^2$, $R^3$, $R^4$, $R^5$ and $R^6$ may or may not be identical and are selected from hydrogen, alkyl, alkenyl or alkynyl groups that may be linear, branched, cyclic, polycyclic and may be functionalized with oxygen, nitrogen or fluorine containing substituents;

depositing an ultralow k film on said wafer under a RF power density between about 0.05 W/cm² and about 3.0 W/cm²; and treating said ultralow k film to improve the stability of said film, said treating comprises an energy source selected from thermal, chemical, ultraviolet (UV) light, electron beam (e-beam), microwave, plasma and a combination thereof.

28. The method of claim 27 wherein said treating comprises annealing at a temperature not less than about 300° C. for at least about 0.25 hours.

* * * * *